United States Patent [19]

Mitsui et al.

[11] Patent Number: 4,673,476

[45] Date of Patent: Jun. 16, 1987

[54] ANTIREFLECTIVE FILM FOR PHOTOELECTRIC DEVICES AND MANUFACTURING METHOD THEREOF

[75] Inventors: Kotaro Mitsui; Mari Kato; Takao Oda; Susumu Yoshida, all of Itami, Japan

[73] Assignee: Mitsubishi Denki Kabushiki Kaisha, Tokyo, Japan

[21] Appl. No.: 921,149

[22] Filed: Oct. 21, 1986

Related U.S. Application Data

[62] Division of Ser. No. 705,117, Feb. 22, 1985, Pat. No. 4,649,088.

[30] Foreign Application Priority Data

Apr. 2, 1984 [JP] Japan .................................. 59-66891

[51] Int. Cl.[4] ............................................ C23C 14/00
[52] U.S. Cl. ........................... 204/192.28; 204/192.12; 204/192.15; 204/192.26; 204/192.27
[58] Field of Search ............... 428/698, 697, 700, 702, 428/704, 212, 218; 136/243, 256, 257; 204/192.28, 192.27, 192.26, 192.15, 192.12

[56] References Cited

U.S. PATENT DOCUMENTS

| | | | |
|---|---|---|---|
| 3,960,441 | 6/1976 | Kamiya et al. | 350/164 |
| 4,286,009 | 8/1981 | Griest | 428/697 |
| 4,331,737 | 5/1982 | Nishizawa et al. | 428/697 |
| 4,416,952 | 11/1983 | Nishizawa et al. | 428/697 |
| 4,428,979 | 1/1984 | Nakamura et al. | 427/162 |
| 4,428,980 | 1/1984 | Nakamura et al. | 427/162 |
| 4,486,285 | 12/1984 | Aubert | 428/698 |

FOREIGN PATENT DOCUMENTS

| | | |
|---|---|---|
| 3203416 | 8/1982 | Fed. Rep. of Germany . |
| 3212037 | 10/1982 | Fed. Rep. of Germany . |
| 3131958 | 2/1983 | Fed. Rep. of Germany . |
| 3202709 | 8/1983 | Fed. Rep. of Germany . |
| 53-63888 | 7/1978 | Japan . |
| 57-192085 | 11/1982 | Japan . |
| 58-191478 | 11/1983 | Japan . |

OTHER PUBLICATIONS

"Antireflection Layers for GaAs Solar Cells", N. D. Arora et al, J. Appl. Phys. 53 (12, Dec. 1982, pp. 8839-8846.
"Plasma-Enhanced CVD Silicon Nitride Antireflection Coatings for Solar Cells", C. C. Johnson et al, Solar Energy, vol. 31, No. 4, 1983, pp. 355-358.
"Physicochemical Properties of Chemical Vapor-Deposited Silicon Oxynitride from a SiH$_4$—CO$_2$—NH$_3$—H$_2$ System", A. K. Gaind et al, J. Electrochem. Soc., Solid-State Science and Technology, Jan. 1978, pp. 139-145.
"Optical Properties of Reactively Sputtered Ta$_2$O$_5$ Films", F. Rubio et al, J. Vac. Sci. Technol., 21 (4), Nov./Dec. 1982, pp. 1043-1045.
"Anti-Reflection Coatings for Thin-Film Polycrystalline CdS/Cu$_2$S Solar Cells", J. A. Bragagnolo et al, J. Vac. Sci. Technol., 18 (2), Mar. 1981, pp. 364-367.
"Semiconductors and Semimetals", Harold J. Hovel, Thomas J. Watson Research Center, IBM Corp., vol. II, Solar Cells, pp. 203-208.

Primary Examiner—Arthur P. Demers
Attorney, Agent, or Firm—Lowe Price LeBlanc Becker & Shur

[57] ABSTRACT

An antireflective film (7, 8) for photoelectric devices comprises at least a layer having a refractive index being the largest on the side abutting on the light receiving surface (2a) or the light emitting surface of a photoelectric device and continuously decreasing according to the distance outward from said side.

2 Claims, 4 Drawing Figures

ANTIREFLECTIVE FILM FOR PHOTOELECTRIC DEVICES AND MANUFACTURING METHOD THEREOF

This is a division of application Ser. No. 705,117, filed Feb. 22, 1985, now U.S. Pat. No. 4,649,088.

BACKGROUND OF THE INVENTION

1. Field of the Invention

The present invention relates to an antireflective film for photoelectric devices and a manufacturing method thereof and particularly relates to an antireflective film having low reflectance with respect to the light in a wide range of wavelength and a manufacturing method thereof.

2. Description of the Prior Art

As an example of a conventional photoelectric device, a Si solar cell 11 as shown in a sectional view of FIG. 1 will be described in the following. On a p-type Si substrate 1, an n-type Si layer 2 is formed by an impurity diffusion method or the like and a p-n junction 3 formed in the interface between the substrate 1 and the layer 2 produces a photovoltaic effect. A p-type electrode 4 is formed on the substrate 1 and an n-type electrode 5 is formed on the n-type layer 2, these electrodes serving for applying electric power to the external circuits. On the surface 2a of the n-type layer 2 onto which light is applied, an antireflective film 6 is formed. Design and manufacturing methods of such antireflective films are described in "Semiconductors and Semimetals", Vol. 11, Solar Cells, pp. 203-207, 1975, published by ACADEMIC PRESS of New York. Generally, the antireflective film 6 is designed in the following manner. The refractive index $n_1$ of the material of the antireflective film 6 is selected to be equal or approximate to a value represented by the relation:

$$n_1 = \sqrt{n_0 \cdot n_2},$$

where $n_0$ is the refractive index of the air or protective cover material and $n_2$ is the refractive index of Si. For example, in case of the air where $n_0=1$, the value of $n_1$ becomes approximately 1.9 since $n_2=3.6$. A solar cell is practically protected and covered with resin or glass or the like (where $n_0 \simeq 1.45$) and in such case, the value of $n_1$ becomes approximately 2.3. For the antireflective film 6 of $n_1=1.9$ approximately, an evaporated SiO film is generally utilized and for the antireflective film of $n_1=2.3$ approximately, a sputtered or thermally oxidized $Ta_2O_5$ film or the like is utilized. The thickness $d$ of the antireflective film 6 is set to a value obtained by the following equation so that the thickness $d$ is adapted for the sunlight spectrum.

$$d = 6000/(4 \cdot n_1) \text{ Å}$$

Accordingly, the value $d$ becomes approximately 790Å in case of SiO and approximately 650Å in case of $Ta_2O_5$. By thus selecting the value $d$, the reflectance becomes nearly equal to 0 in the vicinity of the wavelength of 600 nm. However, as the wavelength deviates from such value, the reflectance gradually increases. The Si solar cell responds to the light in a wavelength range from approximately 300 nm to 1100 nm and in this wavelength range, the average reflectance in case of using the above described antireflective film is approximately 10% (see FIG. 3). In order to further decrease the reflectance, a multilayer film including two layers or more instead of a single layer may be employed as the antireflective film. For example, if a two-layer film is employed, assuming that the refractive index of the upper layer is $n_{1U}$, that the refractive index of the lower layer is $n_{1L}$ and that the refractive index of silicon is $n_2$, the following relation is preferred.

$$n_{1U}/n_{1L} = \sqrt{n_0/n_2}$$

For example, if $n_{1U} \simeq 1.4$ and $n_{1L} \simeq 2.6$, the thicknesses $d_1$ and $d_2$ of the upper and lower layers respectively are represented by the following equation:

$$n_{1U} \cdot d_1 = n_{1L} \cdot d_2 = 6000/4 \text{ Å}$$

and accordingly, $d_1 \simeq 1070$Å and $d_2 \simeq 580$Å are obtained. Using the antireflective film having such values, a low reflectance of 3% on the average can be obtained in a wavelength range of 300 nm to 1100 nm. However, in reality, it is difficult to obtain materials exactly meeting such conditions. As a result, materials such as $SiO_2$ or $T_iO_2$ having conditions approximate thereto are generally employed and consequently the reflectance becomes higher than the above described desirable value. In case of a multilayer film including two layers or more, the reflectance would increase largely if the film thickness deviates a little from the optimum values, and accordingly an extremely strict precision is needed for control of the film thickness.

As described above, in case of a single layer antireflective film, manufacture thereof is relatively easy but the average reflectance cannot be much lowered. On the other hand, in case of a multilayer antireflective film, the average reflectance can be considerably lowered in the optimum conditions but in order to satisfy the optimum conditions, an extremely high degree of manufacturing technique is required.

SUMMARY OF THE INVENTION

An object of the present invention is to provide an antireflective film for photoelectric devices, by which the above described disadvantages in the conventional films can be overcome.

Another object of the present invention is to provide a simple method of manufacturing the above described antireflective film.

A main feature of the present invention is that an antireflective film includes at least a layer having refractive index which decreases continuously according to the distance outward from the side abutting on the light receiving surface (or the light emitting surface) of a photoelectric device, so that low reflectance can be obtained in a wide range of wavelength.

Another feature of the present invention is that a manufacturing method of an antireflective film comprises the steps of: providing a photoelectric apparatus; setting the photoelectric device in a chamber of a sputtering apparatus; introducing a reactive gas containing nitrogen and an inert gas into the chamber to start reactive sputtering with tantalum, tantalum oxide, aluminum, aluminum oxide or silicon as a target to be sputtered; performing reactive sputtering for a prescribed period of time while increasingly adding a reactive gas containing oxygen into the chamber; and subsequently performing reactive sputtering for a prescribed period of time while decreasing the reactive gas containing nitrogen in the chamber.

A further feature of the present invention is that a method of manufacturing an antireflective film on the light receiving surface or the light emitting surface of a photoelectric device comprises the steps of: providing a photoelectric device; setting the photoelectric device in a chamber of a sputtering apparatus; introducing a reactive gas containing nitrogen and an inert gas into the chamber to start reactive sputtering with tantalum, tantalum, oxide, aluminum or aluminum oxide as a target to be sputtered; performing reactive sputtering for a prescribed period of time while increasingly adding a reactive gas containing oxygen into the chamber; subsequently performing reactive sputtering for a prescribed period of time while decreasing the reactive gas containing nitrogen in the chamber; after exhaustion of all the reactive gases, subsequently introducing again a reactive gas containing nitrogen and an inert gas into the chamber to start reactive sputtering with silicon or silicon oxide as a target to be sputtered; performing reactive sputtering for a prescribed period of time while increasingly adding a reactive gas containing oxygen into the chamber; and performing reactive sputtering for a prescribed period of time while decreasing the reactive gas containing nitrogen in the chamber.

These objects and other objects, features, aspects and advantages of the present invention will become more apparent from the following detailed description of the present invention when taken in connection with the accompanying drawings.

DETAILED DESCRIPTION OF THE PREFERRED EMBODIMENTS

In the following, an embodiment of the present invention will be described with reference to the drawings.

Figure 1:
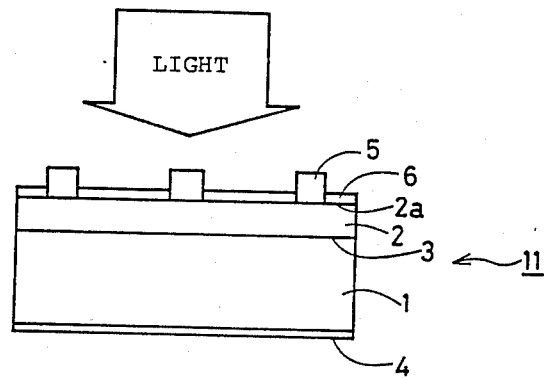
FIG. 1 is a sectional view of a conventional Si solar cell.
Figure 2:
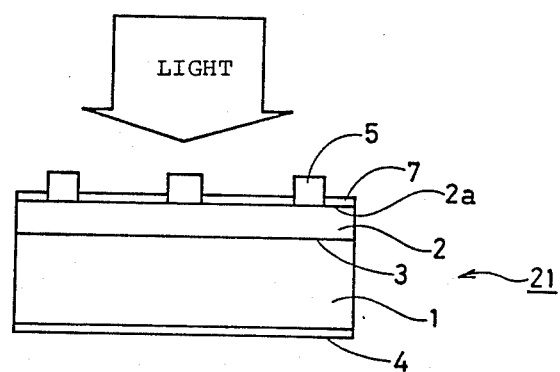
FIG. 2 is a sectional view of a Si solar cell of an embodiment of the present invention.

FIG. 2 is a sectional view of a Si solar cell to which an antireflective film in accordance with the present invention is applied. A p-type Si substrate 1, an n-type layer 2, a p-n junction 3, a p-type electrode 4 and an n-type electrode 5 are formed in the same manner as in the conventional Si solar cell 1. An antireflective film 7 in accordance with the present invention has the reflectance which is the largest in a portion in contact with the n-type layer surface 2a and decreases continually as the distance outward from the n-type layer surface 2a becomes large, as is different from the conventional antireflective film 6.

Now, description will be made of a manufacturing method of the above described antireflective film. First, a Si solar cell having a p-n junction near the surface is provided. Then, after the n-type layer surface 2a on which an antireflective film for the Si solar cell is to be formed is sufficiently made clean, the solar cell is set in a chamber of a sputtering apparatus (not shown) using tantalum as a target to be sputtered. After sufficiently evacuating the chamber, reactive sputtering with tantalum is started using argon gas (partial pressure: 1 m Torr). At the time of starting the sputtering, ammonia gas having a partial pressure of 1 m Torr is mixed as a reactive gas in the argon gas atmosphere in the chamber. As the time passes by, reactive sputtering is performed increasingly adding oxygen gas in the above described atmosphere at a rate of 0.005 m Torr/sec. Then, after a lapse of 200 seconds, reactive sputtering is performed decreasing the ammonia gas in the above described atmosphere at a rate of 0.005 m Torr/sec. After further 200 seconds have passed, the ammonia gas is completely dissipated in the atmosphere and then the reactive sputtering is ended. In the above described manner, an antireflective film 7 is formed to contain tantalum nitride in the portion in contact with the n-type layer surface 2a, tantalum oxynitride having the oxygen component increasing and the nitrogen component decreasing according to the distance outward from this portion and tantalum oxide on the outermost surface.

Figure 3:
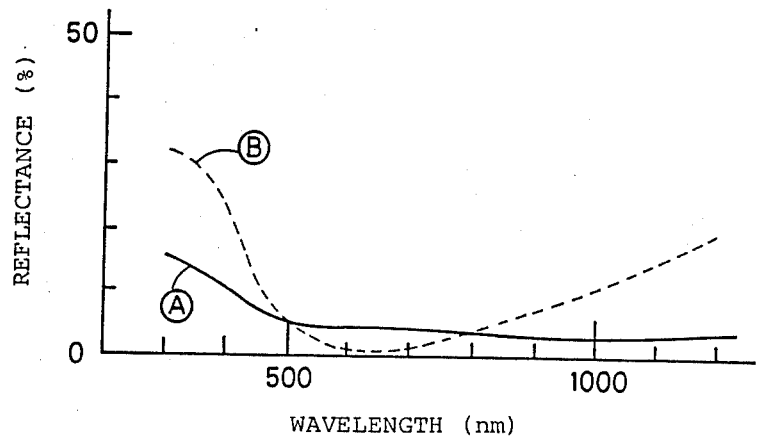
FIG. 3 is a graph showing reflectance on the surface of a conventional Si solar cell and reflectance on the surface of a Si solar cell of the present invention.

This antireflective film 7 has the refractive index continually changing from 2.6 as tantalum nitride to 2.0 as tantalum oxide, as is different from the above described conventional antireflective film 6 which has a constant refractive index in the film thickness direction. When the reflectance was measured with cover glass being attached to the Si solar cell 21 thus formed, an average value of approximately 5% was obtained in a wavelength range of 300 nm to 1100 nm as shown by Ⓐ in FIG. 3. This value is considerably lower than the average reflectance of 10% of the conventional Si solar cell as shown by Ⓑ in FIG. 3. In the Si solar cell 21 to which an antireflective film of the present invention is applied, the reflectance is wholly lowered in a wide range of wavelength, which is different from the conventional Si solar cell having large dependence on the wavelength.

While the reflectance of the conventional Si solar cell largely changes dependently on the thickness of the antireflective film, the reflectance of the Si solar cell 21 using the antireflective film in accordance with the present invention hardly changes dependently on the film thickness and accordingly there is an advantage that control of the fabricating process thereof is extremely easy.

Although in the above described embodiment, tantalum was used as a target to be sputtered at the time of forming the antireflective film 7, tantalum oxide, aluminum, aluminum oxide or silicon may be used. When tantalum oxide was used, the average reflectance was approximately 6%. This is because the refractive index is lowered a little to 2.4 due to a small amount of oxygen contained in the portion contacting the n-type layer surface 2a, as compared with the case using tantalum as a target. When silicon was used as a target, the average reflectance was as high as 8% since the refractive index in the portion contacting the n-type layer surface 2a was further lowered. However, the average reflectance 8% in this case is still lower than the average reflectahce 10% of the conventional Si solar cell.

Figure 4:
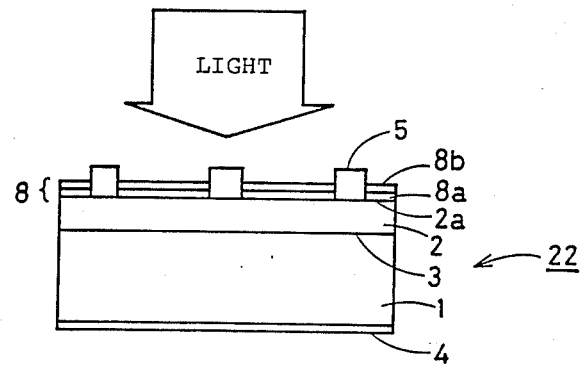
FIG. 4 is a sectional view of a Si solar cell of another embodiment of the present invention.

FIG. 4 is a sectional view of a Si solar cell to which an antireflective film of another embodiment of the present invention is applied. On the n-type layer surface 2a, a first antireflective layer 8a is formed to have contents gradually changing from tantalum nitride via tantalum oxynitride to tantalum oxide toward the outside by applying reactive sputtering using tantalum as a target in the same manner as shown in FIG. 2. Then, on the first antireflective layer 8a, a second antireflective layer 8b is formed to have contents gradually changing from silicon nitride via silicon oxynitride to silicon oxide toward the outside by applying reactive sputtering using silicon as a target. For formation of the second antireflective layer 8b, in the same manner as for the first antireflective layer 8a, the chamber of the sputtering apparatus is made to be in the ammonia atmosphere at the time of starting reactive sputtering. By gradually increasing oxygen gas as the time passes, reactive sputtering is performed for a prescribed period of time. Then, by decreasing ammonia gas in the above described atmosphere, reactive sputtering is performed for a prescribed period of time and when only oxygen gas is contained as the reactive gas component in the atmosphere, the reactive sputtering is brought to an end. In a portion of the first antireflective layer 8a contacting the second antireflective layer 8b, tantalum oxide having a refractive index of 2.0 is formed and in a portion of the second antireflective layer 8b contacting the first antireflective layer 8a, silicon nitride having a refractive index of 2.0 is formed. Accordingly, an antireflective film 8 having a refractive index continuouslly changing from 2.6 as tantalum nitride to 1.45 as silicon oxide is formed. When the reflectance was measured after attaching cover glass to the surface of the Si solar cell 22 thus formed, an extremely low value of 3% was obtained on the average in a wavelength range of 300 nm to 1100 nm. This is because the film 8 has wider range of refractive indexes is covered as compared with the film 7 in FIG. 2. Needless to say, the reflectance of this Si solar cell 22 also has little dependence on the film thickness.

Although in the above described embodiments, the case using a silicon solar cell was described, an antireflective film in accordance with the present invention may also be applied to solar cells or any other light receiving photoelectric devices of any materials. Furthermore, an antireflective film in accordance with the present invention may also be applied to light emitting photoelectric devices such as light emitting diodes which emit light from a material of high refractive index to a medium of low refractive index in the opposite manner. As a target to be sputtered, only tantalum, tantalum oxide, silicon and silicon oxide were indicated in the above described embodiments. However, other elements for example aluminum or aluminum oxide may be employed as far as the refractive index decreases according to the change from a nitride via an oxynitride to an oxide.

Although the present intention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an antireflective film on the light receiving surface or the light emitting surface of a photoelectric device, comprising the steps of:

setting said photoelectric device in a chamber of a sputtering device, introducing an inert gas and an active gas containing nitrogen into said chamber to start reactive sputtering with tantalum, tantalum oxide, aluminum, aluminum oxide or silicon as a target to be sputtered, performing reactive sputtering for a prescribed period of time while increasingly adding a reactive gas containing oxygen into said chamber, and subsequently performing reactive sputtering for a prescribed period of time while decreasing said reactive gas containing nitrogen in said chamber.

2. A method of manufacturing an antireflective film on the light receiving surface or the light emitting surface of a photoelectric device, comprising the steps of:

providing said photoelectric device, setting said photoelectric device in a chamber of a sputtering device, introducing an inert gas and a reactive gas containing nitrogen into said chamber to start reactive sputtering with tantalum, tantalum oxide, aluminum or aluminum oxide as a target to be sputtered, performing reactive sputtering for a prescribed period of time while increasingly adding a reactive gas containing oxygen into said chamber, performing reactive sputtering for a prescribed period of time while decreasing said reactive gas containing nitrogen in said chamber, after exhaustion of all the reactive gases, introducing again an inert gas and a reactive gas containing nitrogen into said chamber to start reactive sputtering with silicon or silicon oxide as a target to be sputtered, performing reactive sputtering for a prescribed period of time while increasingly adding a reactive gas containing oxygen into said chamber, and performing reactive sputtering for a period of time while decreasing said reactive gas containing nitrogen in said chamber.

* * * * *